United States Patent
Lee et al.

(10) Patent No.: US 11,876,497 B2
(45) Date of Patent: Jan. 16, 2024

(54) AUTOMATIC PROGRESSIVE TRANSITION OF VOLUME ADAPTATION TO ENVIRONMENTAL NOISE

(71) Applicant: Google LLC, Mountain View, CA (US)

(72) Inventors: Jae Lee, Palo Alto, CA (US); Priya Kasirajan, Los Gatos, CA (US)

(73) Assignee: Google LLC, Mountain View, CA (US)

( * ) Notice: Subject to any disclaimer, the term of this patent is extended or adjusted under 35 U.S.C. 154(b) by 84 days.

(21) Appl. No.: 17/632,583

(22) PCT Filed: Sep. 6, 2019

(86) PCT No.: PCT/US2019/049958
§ 371 (c)(1),
(2) Date: Feb. 3, 2022

(87) PCT Pub. No.: WO2021/045779
PCT Pub. Date: Mar. 11, 2021

(65) Prior Publication Data
US 2022/0294405 A1    Sep. 15, 2022

(51) Int. Cl.
*H03G 3/32*    (2006.01)
*H03G 5/16*    (2006.01)

(52) U.S. Cl.
CPC ............... *H03G 3/32* (2013.01); *H03G 5/165* (2013.01)

(58) Field of Classification Search
CPC ............. H03G 3/32; H03G 5/165; H03G 3/04
USPC .............................................. 381/57, 104–109
See application file for complete search history.

(56) References Cited

U.S. PATENT DOCUMENTS

| | | | | |
|---|---|---|---|---|
| 5,204,971 A | * | 4/1993 | Takahashi | H03G 3/32 455/185.1 |
| 5,907,622 A | * | 5/1999 | Dougherty | H03G 3/32 381/108 |
| 8,494,172 B2 | * | 7/2013 | Cheek | H03G 3/32 381/94.1 |
| 8,718,305 B2 | | 5/2014 | Usher et al. | |

(Continued)

FOREIGN PATENT DOCUMENTS

EP    1210767 B1    7/2007

OTHER PUBLICATIONS

International Preliminary Report on Patentability for International Application No. PCT/US2019/049958 dated Mar. 17, 2022. 11 pages.

(Continued)

*Primary Examiner* — Xu Mei
(74) *Attorney, Agent, or Firm* — Colby Nipper PLLC

(57) ABSTRACT

The present disclosure provides systems and methods for progressively transitioning the playback volume based on a background noise level. The device may have a predetermined quantity of volume levels between a minimum volume and a maximum volume. The volume levels may be spaced by predetermined increments, such that there is a predefined difference between adjacent volume levels. A digital gain may be used to adjust the volume level and an analog gain may allow for the playback volume to be adjusted to an amount between adjacent volume levels. The playback volume may progressively transition within the predefined volume levels by an amount less than the predetermined difference between adjacent volume levels. This smaller amount may be the analog gain.

19 Claims, 9 Drawing Sheets

(56) References Cited

U.S. PATENT DOCUMENTS

| | | | |
|---|---|---|---|
| 9,037,276 B2* | 5/2015 | Armstrong | H03G 3/32 |
| | | | 381/104 |
| 2016/0056781 A1 | 2/2016 | Rose et al. | |
| 2017/0048615 A1 | 2/2017 | Son et al. | |

OTHER PUBLICATIONS

International Search Report and Written Opinion for International Application No. PCT/US2019/049958 dated Jun. 3, 2020. 3 pages.

* cited by examiner

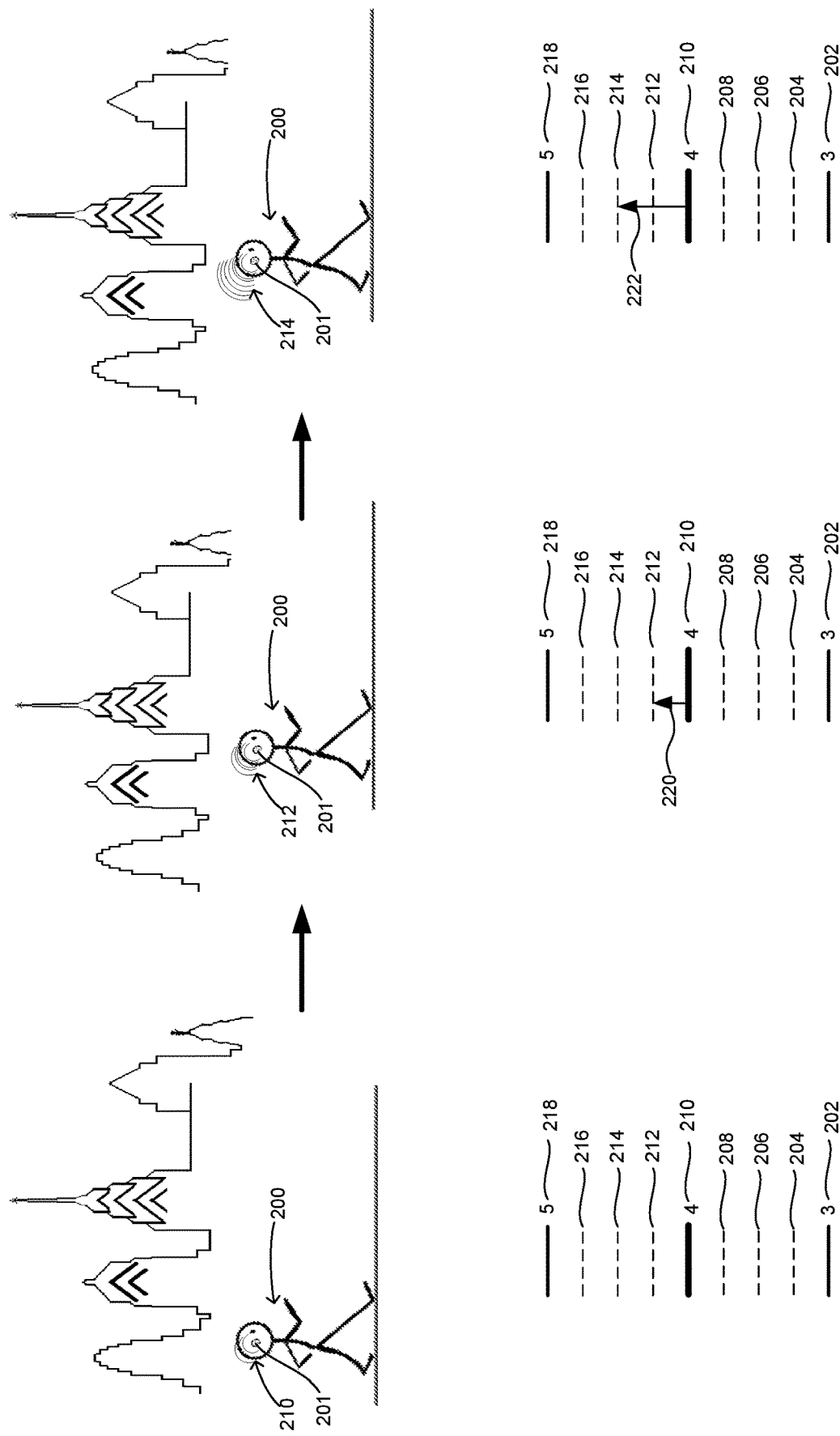

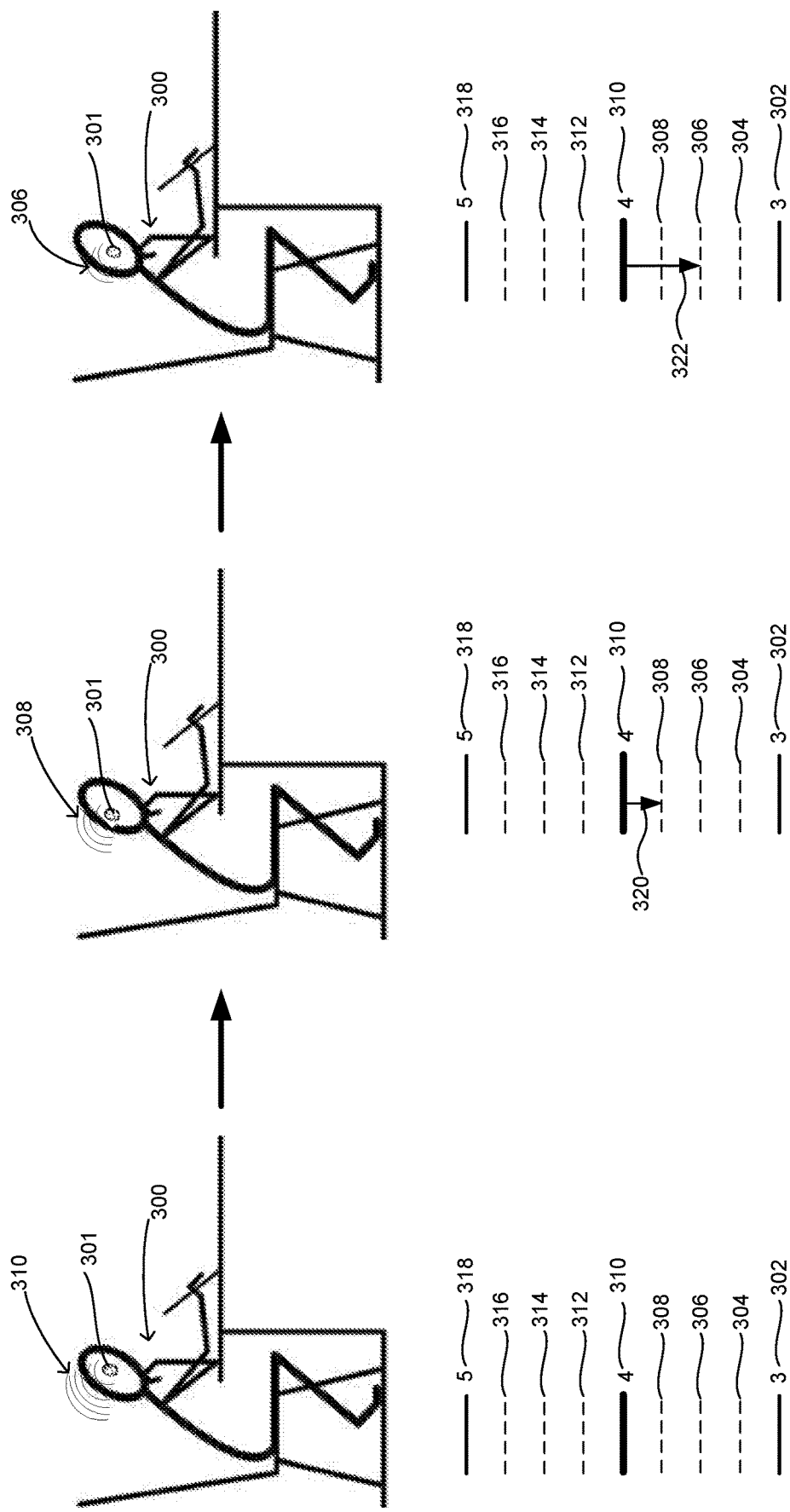

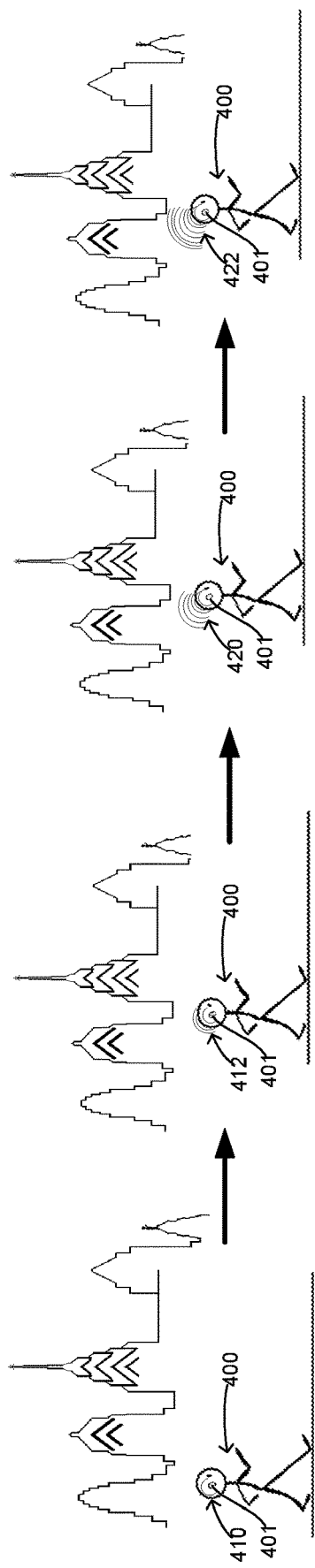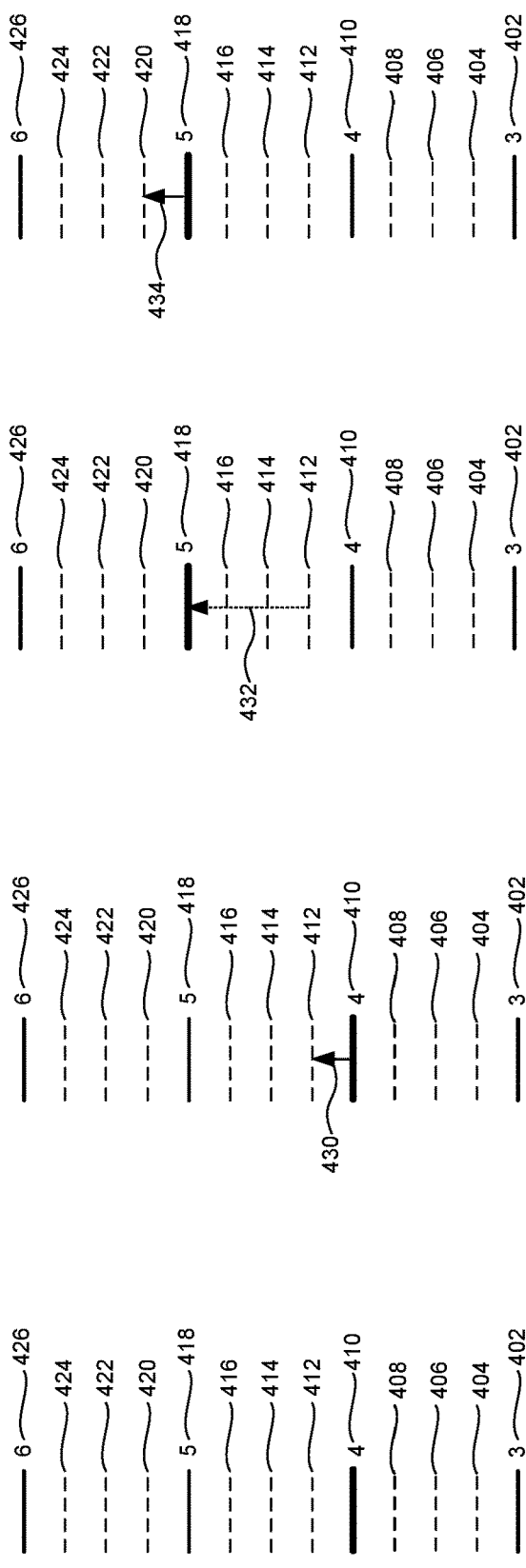
FIG. 4A  FIG. 4B  FIG. 4C  FIG. 4D

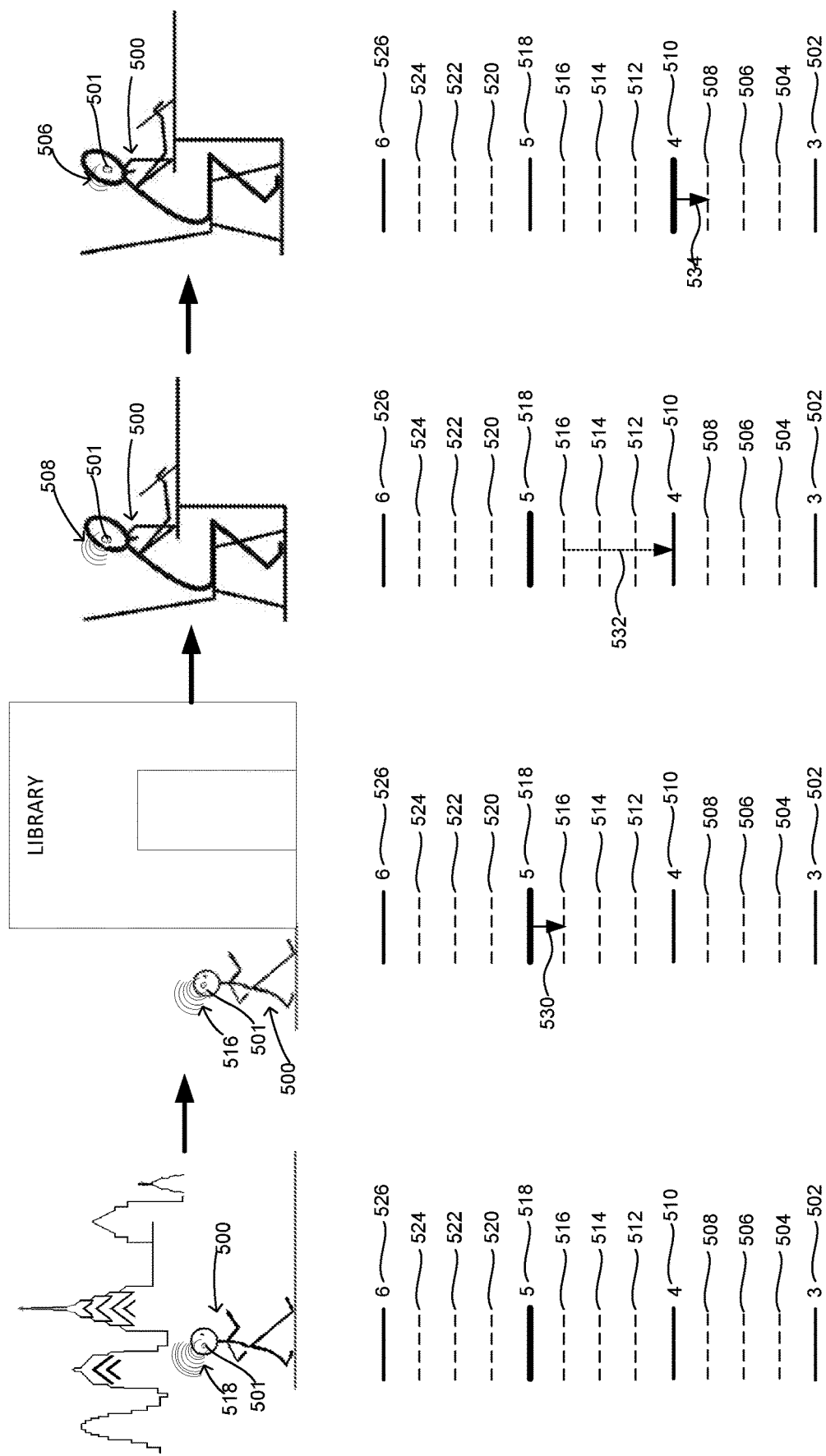

| Volume Level | A-Weighted Playback Level (dBA) | Background Noise Crossing at 2000Hz (dB) | Background Noise Estimator (dB) |
|---|---|---|---|
| 1 | 52.6 | | |
| 2 | 55.6 | 55 | -11.5 |
| 3 | 58.7 | | |
| 4 | 61.4 | | |
| 5 | 64.3 | 65 | -1.5 |
| 6 | 67.4 | | |
| 7 | 70.5 | | |
| 8 | 73.5 | | |
| 9 | 76.5 | 75 | 7.5 |
| 10 | 82.6 | | |
| 11 | 85.6 | | |
| 12 | 88.5 | 85 | 17 |
| 13 | 91.5 | | |
| 14 | 94.5 | | |
| 15 | 97.3 | 94 | 26.5 |

AUTOMATIC PROGRESSIVE TRANSITION OF VOLUME ADAPTATION TO ENVIRONMENTAL NOISE

CROSS-REFERENCE TO RELATED APPLICATIONS

The present application is a national phase entry under 35 U.S.C. § 371 of International Application No.: PCT/US2019/049958, filed Sep. 6, 2019, the entire disclosure of which is incorporated herein by reference.

BACKGROUND

Many devices, including earbuds, smartphones, and smartwatches, provide for sound playback. Each device may have a default quantity of increments between a minimum volume and a maximum volume. Each device may have a different default increase or decrease in volume from one increment to the next adjacent increment. In some instances, to change the volume coming from the device, a user may provide an input. The input may increase or decrease the volume one increment at a time. A user may have to provide numerous inputs to obtain a desired volume.

BRIEF SUMMARY

One aspect of the disclosure provides for a device having a first amplifier configured to adjust a playback volume of the device among first increments in a volume table, one or more processors configured to determine a background noise level, and a second amplifier in communication with the one or more processors. The volume table may include a plurality of the first increments between a minimum volume and a maximum volume. Each of the plurality of increments may be spaced by a predetermined different. The second amplifier may be configured to adjust the playback volume, in response to the determined background noise level, by second increments. The second increments may be smaller than the first increments.

The device may further comprise one or more microphones configured to receive audio input and one or more speakers for audio output. The determined background noise level may be based on the received audio input. The first amplifier may be a digital amplifier and the second amplifier may be an analog amplifier. Each of the first increments may encompass a plurality of the second increments. Adjusting the playback volume using the second amplifier may not adjust the playback volume using the first amplifier.

In some instances, when the difference between the determined background noise level and the playback volume is less than the predetermined difference, adjusting the playback volume may further comprise adjusting the playback volume by up to an amount equivalent to one of the first increments. Additionally or alternatively, when the difference between the determined background noise level and the playback volume is greater than or equal to the predetermined difference, adjusting the playback volume may further comprise adjusting the volume by up to an amount equivalent to two of the first increments.

Another aspect of the disclosure provides a method for automatically progressively transitioning the playback volume of a device based on the background noise level. The method includes receiving, from one or more microphones, an audio input, determining, with one or more processors based on the received audio input, a background noise level, determining, with the one or more processors based on the background noise level, an adjustment amount less than a predetermined difference, and adjusting, using the one or more processors based on the determined adjustment amount ad at least one amplifier, a playback volume by the adjustment amount. The predetermined difference may be the difference between adjacent increments in a volume table. The volume table may include a total number of increments between a minimum volume and a maximum volume.

Yet another aspect of the disclosure provides for a non-transitory computer-readable storage medium storing instructions executable by a processor for performing a method for automatically progressively transitioning the playback volume of a device based on the background noise level. The method includes determining a background noise level and adjusting, based on the determined background noise level and using at least one amplifier, a playback volume by one or more first increments. The one or more first increments are smaller than each of a plurality of second increments. Each of the plurality of second increments may be spaced by a predetermined difference within a volume table. The volume table may include a total number of second increments between a minimum volume and a maximum volume.

Yet another aspect of the disclosure provides for an audio playback device comprising one or more microphones, one or more speakers for playback of audio output, a memory for storing a volume table, and one or more processors in communication with the one or more microphones and the memory. The volume table may include a total number of increments between a minimum volume and a maximum volume wherein each increment may be spaced by a predetermined difference. The one or more processors may be configured to receive input from the one or more microphones, determine a background noise level based on the receive input, and adjust a playback volume based on the determined background noise level. Adjusting the playback volume may raise or lower the playback volume an amount less than the predetermined difference.

BRIEF DESCRIPTION OF THE DRAWINGS

FIGS. 2A-2C are pictorial and graphical diagrams illustrating an example of the progressive transition of the playback volume as the device moves into a location with an increased background noise level according to aspects of the disclosure.

FIGS. 3A-3C are pictorial and graphical diagrams illustrating an example of the progressive transition of the playback volume as the device moves into a location with a decreased background noise level according to aspects of the disclosure.

FIGS. 4A-4D are pictorial and graphical diagrams illustrating another example of the progressive transition of the playback volume as the device moves into a location with an increased background noise level according to aspects of the disclosure.

FIGS. 5A-5D are pictorial and graphical diagrams illustrating an example of the progressive transition of the playback volume when going from a location with an increased background noise level to a location with a decreased background noise level according to aspects of the disclosure.

DETAILED DESCRIPTION

Figure 1A:
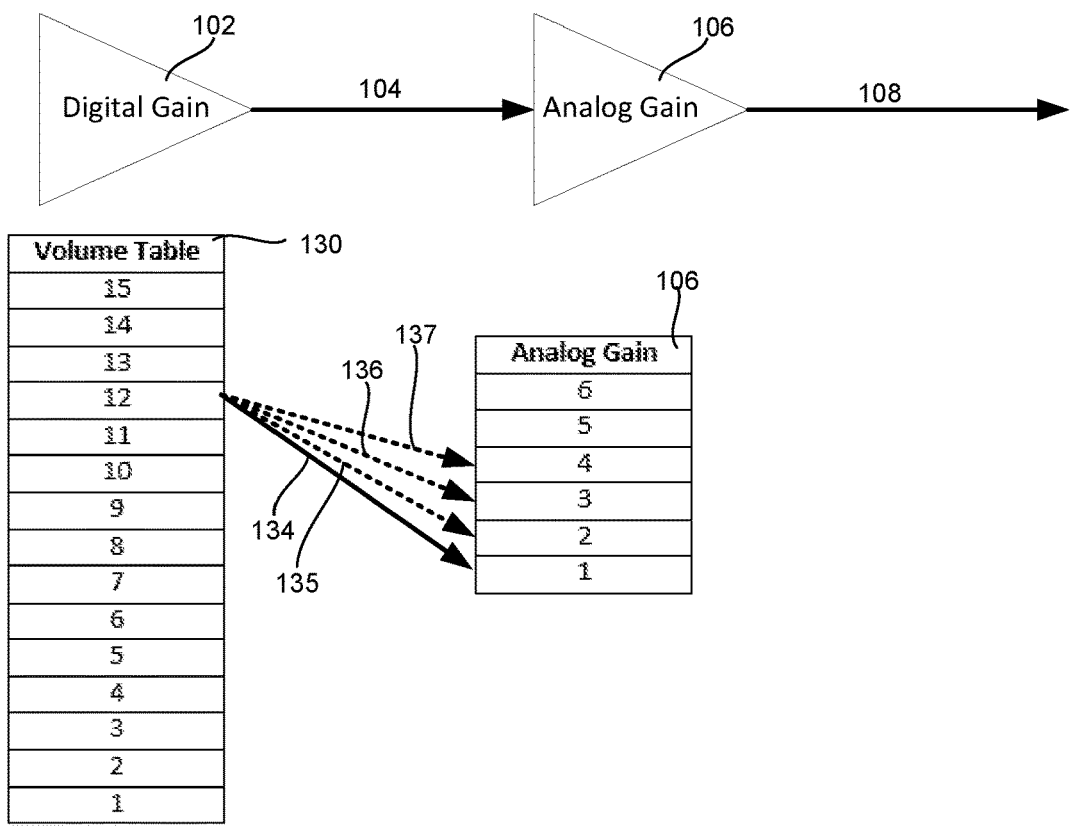
FIG. 1A illustrates an example of a volume table associated with digital gain in relation to analog gain according to aspects of the disclosure.

The systems and methods described herein relate to an audio playback device that may allow for progressively transitioning a playback volume based on a background noise level. The device may have a default quantity of volume levels between a minimum volume and a maximum volume. The volume levels may be spaced by predetermined increments, such that there is a predefined increase or decrease in playback volume between adjacent volume levels. The size of each predetermined increment, such as the difference between one volume level and an adjacent volume level, is referred to herein as a loudness delta. In some instances, the loudness delta may be measured in decibels ("dB") or decibels of sound pressure level ("dB SPL"). The device may have a default loudness delta. The playback volume may progressively transition within the predefined volume levels. For example, if the background noise level is high, the playback volume may progressively transition to an increased playback volume in an amount smaller than the loudness delta. If the background noise level is low, the playback volume may progressively transition to a decreased playback volume in an amount smaller than the loudness delta.

The audio playback device may include earbuds, an augmented reality and/or virtual reality headset, Bluetooth enabled headset, smart glasses, head-mountable displays, smart watches, mobile phone and/or smart phones, tablets, music players, etc. The device may include input, internal electronics, and output.

The input may include a user input and an audio detection input. For example, the user input may be a touch-sensitive housing, dial, button, or other control for receiving a manual command. Additionally or alternatively, the user input may include one or more microphones for receiving a verbal command. Other types of user input, such as motion sensors or other types of sensors, may be adapted to receive gesture input or the like. The user input may allow the user to change the playback volume to one of the predetermined volume levels in a volume table. The volume table may include a total number of volume levels between a minimum volume and a maximum volume. The volume levels may also be referred to herein as volume increments or steps. The audio detection input may include, for example, one or more microphones configured to receive audio input signals. For example, the one or more microphones may receive audio input signals, which may be further received by one or more processors that determine the background noise level based on the received audio input signal. In some examples, the microphone used for user input may also be used for audio detection input.

The output may include one or more speakers for outputting audio, such as playback of music, speech, or other audio content.

The internal electronics may control the playback volume of the device. For example, the internal electronics may amplify an output signal for playback through the speakers by applying a digital gain and/or an analog gain. The digital gain may be applied to the signal, such that the playback volume increases or decreases. For example, the user may provide an input command to adjust a volume level, thereby causing the internal electronics to apply a digital gain. The digital gain may correspond to the change in volume level on the volume table of the device.

Between each adjacent volume level, an amplifier may adjust the analog gain, thereby adjusting the playback volume without adjusting the digital gain on the device. The analog gain may adjust the playback volume in an amount less than the predetermined difference between adjacent volume levels. Thus, the analog gain may result in a playback volume between levels in the volume table. For example, the device may have a current playback volume set to volume level 12. In response to the determined background noise, the analog gain may cause the playback volume to automatically change, such that the playback volume may increase or decrease an amount less than the loudness delta, but the volume level will not change from volume level 12. Thus, the playback volume may change without receiving a user input.

The analog gain may be a negative analog gain, such that when the negative analog gain is added to the playback volume the playback volume may decrease. According to some examples, a negative analog gain may be an analog loss.

The analog gain may progressively increase or decrease the playback volume based on the background noise level. The analog gain may allow for finer volume adjustments. The analog gain may increase or decrease the playback volume in analog increments. Analog increments may be an amount, measured in dB, less than the predetermined difference between adjacent volume levels. For example, if the playback volume of the device is set to volume level 12 on the volume table, the analog gain may have 6 increments. However, there can be any number of increments—a few, a few hundred, etc. Each analog increment of the analog gain may progressively increase or decrease the playback volume without changing the digital gain. The device does not change its volume level to volume level 11 or 13. Therefore, according to some aspects of the disclosure, the analog gain may adjust the playback volume by one or more analog increments. The analog increments may be an amount measured in dB. The analog increments may be based on the background noise level. As one example, the analog increment may be based on a comparison between the loudness delta and the difference between the background noise level and the playback volume. For example, the analog increment may be determined as follows:

loudness delta≥(background noise level−playback volume)

or loudness delta≤(background noise level−playback volume)

In other examples, rather than defined increments, the analog gain may be adjusted to any calculated dB, including tenths or hundredths of dBs. In some instances, the analog gain may be predetermined for each device For example, the predetermined or default analog gain of the device may be referred to as analog gain level 1, or 0 dB gain. The analog gain for level n, in decibels, may be calculated using the following formula: 20 log((Analog Gain Level n)/(Default Analog Gain)). For example, where the default analog gain is predetermined to be 2V at analog gain volume 1 and analog gain level 6 is 4V, the analog gain in decibels would be 6 dB because 20 log(4V/2V)=6 dB.

As shown in FIG. 1A, the playback volume may be set to volume level 12 of volume table 130. The background noise level may be determined, as shown by arrow 104, between digital gain 102 and analog gain 106. The background noise level may be determined based on the audio input received by one or more microphones of the device. Once the background noise level is determined, analog gain 106 may adjust the current playback volume 108 without receiving a user input. The device may determine the amount of analog gain 106 in one of the ways described above. For example, volume level 12 may have a playback volume of 88.5 dB and volume level 13 may have a playback volume of 91.5 dB. Therefore, the loudness delta may be 3 dB. It should be understood that this is merely an example, and the loudness delta may be higher or lower in other examples. The device may then compare the loudness delta to the difference between the current playback volume and the determined background noise level. When the loudness delta is greater than or equal to the difference between the current playback volume and the determined background noise level, the analog gain 106 may be, for example, up to 6 dB. If the loudness delta is less than the difference between the current playback volume and the determined background noise level, the analog gain 106, may be, for example, up to 3 dB. The total amount of analog gain may depend on any combination of the device, the loudness delta, the background noise level, and the current playback volume. Therefore, the total amount of analog gain may be more or less than 3 dB or 6 dB. For example, the total amount of analog gain may be 1 dB, 1.5 dB, 4 dB, 6.25 dB, etc. Thus, the total amount of analog gain can be in tenths, hundredths and tens and hundreds of dB. The total amount of analog gain may then be split into analog increments. For example, in instances where the analog gain 106 is up to 6 dB, each analog increment 1-6 of analog gain 106 may be 1 dB each. The transition of playback volume may occur in a predefined time. For example, the progressive transition of the playback volume may occur over a period of three seconds. The period of three seconds is just an example. Therefore, the transition may occur over a period of milliseconds, 5 seconds, 10 seconds, etc.

Figure 1B:
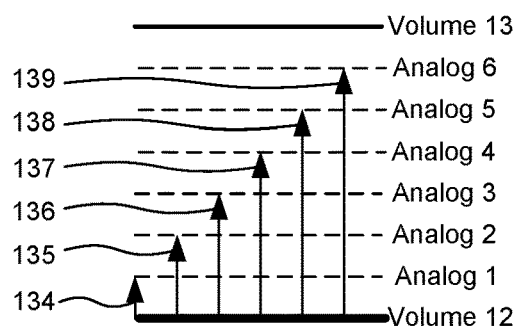
FIG. 1B illustrates an example of analog gain according to aspect of the disclosure.

FIG. 1B illustrates analog increments between adjacent volume levels. In this example, the following calculations are based on volume increment 12 having a playback volume of 108 dB and the analog gain is in seven increments, each increment being 1 dB, such that an increase 134 from volume increment 12 to analog increment 1 may result in a playback volume 108 of 89.5 dB. An increase 135 to analog increment 2 may result in a playback volume 108 of 90.5 dB. An increase 136 to analog increment 3 may result in a playback volume 108 of 91.5 dB. An increase 137 to analog increment 4 may result in a playback volume 108 of 92.5 dB. An increase 138 to analog increment 5 may result in a playback volume 108 of 93.5 dB. An increase 139 to analog increment 6 may result in a playback volume 108 of 94.5 dB. The playback volume 108, volume level 12 plus analog gain 106 (i.e. at least one of analog increments 1-6), may exceed the playback volume for the adjacent volume level (i.e. volume level 13). However, the volume level may not change as perceived by the user as there was no digital gain 102. Thus, the user may only see that the volume level is 12 but the playback volume may have changed. The calculations provided are merely an example. Thus, depending on the playback volume for the volume level, the value of the analog increment, and the number of increments, the calculations may change.

Figure 1C:
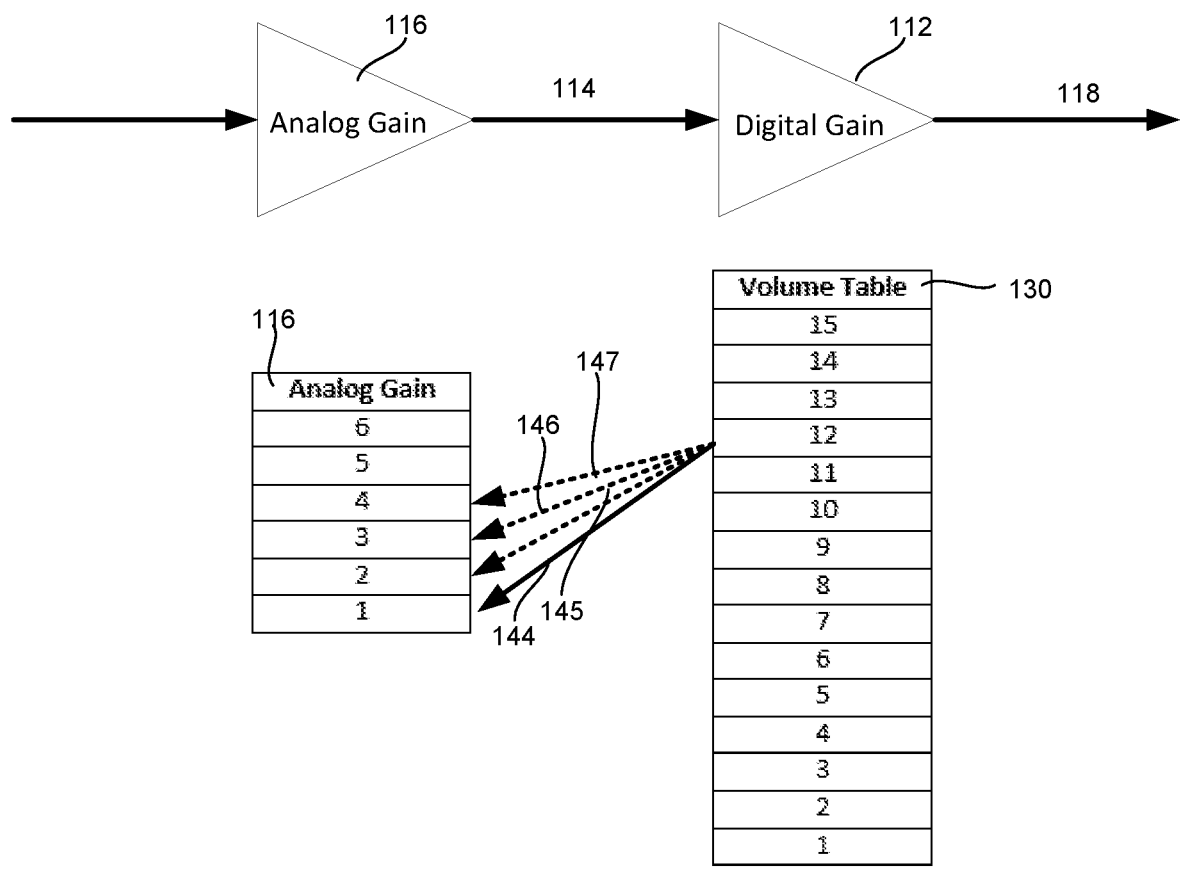
FIG. 1C illustrates another an analog gain in relation to a volume table according to aspects of the disclosure.

FIG. 1C is similar to that of FIG. 1A, however, the analog gain may be applied before the digital gain. For example, the analog gain may be applied at a default level for the device, such as analog gain level 1, or 0 dB gain. Once the background noise level is determined, the analog gain may be adjusted in order to progressively transition the volume of the playback device. The digital gain may be unchanged despite the presence of background noise, whether it is applied before or after the analog gain.

FIGS. 2A-2C illustrate the progressive transition of the playback volume in a location with an increased or relatively loud background noise level. For example, in a city setting, the background noise level may be between 80-90 dB. The background noise may change as the user is walking through the city. For example, the user may be walking by a street performance, an outdoor concert, or the user may walk through a congested intersection with car horns honking. The audio playback device may detect such changes in the background noise level, such as through one or more microphones and/or other sensors, and determine a corresponding adjustment for the playback volume. The device progressively transitions the playback volume by adjusting analog gain, without user input, such that the playback volume will increase or decrease automatically. As such, the user does not miss content if the background noise increases, or become overwhelmed by volume if the background noise decreases. Because the adjustments are made automatically, the user does not need to provide manual input for the adjustment, and has an improved user experience.

FIG. 2A illustrates an example where the user 200 may be walking through the city wearing device 201, such as earbuds. The playback volume of device 201 may correspond to volume level 4, which may equal a playback volume of 61.4 dB. Volume levels 202, 210, 218 may correspond to volume level 3, 4, 5 of the volume table, respectively. Each analog increment 204, 206, 208, 212, 214, 216 may correspond an analog gain of 1 dB. However, the analog gain of each analog increment may be determined by the device. For example, the analog gain for each analog increment may be determined based on the maximum possible analog gain determined when comparing the background noise level to the playback volume. Therefore, the analog gain may be in increments greater than or less than 1 dB. For example, each analog increment may be 0.5 dB, 0.75 dB, 1.5 dB, 2 dB, etc.

FIG. 2B illustrates an example where user 200 enters an atmosphere having an increased background noise level, such as past a street performance. The device 201 was previously set to volume level 4. Device 201 may detect an increase in the background noise level. In response to the increased background noise level, the playback volume of device 201 may automatically increase 220, without the user's input, to analog increment 212 such that the playback volume may become 62.4 dB.

FIG. 2C illustrates an example where user 200 remains in an atmosphere having an increased background noise level. The device 201 was previously set to volume level 4 and an analog gain 220 was already applied to device 201, such that the current playback volume is volume level 4 plus analog increment 212. The playback volume of device 201 may continue to increase 222 to analog increment 214 such that the playback volume may become 63.4 dB. While not shown, if the background noise level increases or the device determines that further analog gain is required, the playback volume of device 201 may automatically increase up to an analog increment 216 before reaching volume increment 218, corresponding to volume increment 5, which may equal to a playback volume of 64.3 dB. The progressive transition of the playback volume from volume level 4 to volume level 4 plus analog gain 214 may occur over a predetermined period of time. For example, each analog gain may occur over a period of one second such that an increase of two analog gains would occur over a period of two seconds. However, the transition can occur over a period of time greater than or less than two seconds. The progressive transition provides user 201 with a gradual change in playback volume in response to the background noise level.

FIGS. 3A-3C illustrate the progressive transition of the playback volume as the device moves into a location with a decreased, or relatively quiet or low, background noise level. For example, in a library setting, the background noise level may be 30 dB. Accordingly, the playback volume may progressively transition such that the playback volume will decrease according to an analog gain. An analog gain that causes a decrease in playback volume may be a negative analog gain. The negative analog gain may be an analog loss.

FIG. 3A illustrates an example where the user 200 may be sitting in an atmosphere, such as the library, wearing a device 301, such as earbuds. The library may have a decreased background noise level as compared to the city. However, the library may still have background noise, including people whispering, families talking in the children's area, etc. The playback volume of device 301 may correspond to volume level 4 on a volume table, which may equal to a playback volume of 61.4 dB. Volume levels 302, 310, 318 may correspond to volume increments 3, 4, 5 of the volume table, respectively. Each analog increment 304, 306, 308, 312, 314, 316 may correspond to an analog gain. For example, each analog increment may correspond to an analog gain of 1 dB. In other examples, each analog increment can be any value as determined by device 301, such as 0.5 dB, 1.25 dB, 1.5 dB, 1.8 dB, etc.

FIG. 3B illustrates an example where the background noise level has decreased. For example, the people sitting near user 300 may have stopped talking. In response to the decreased background noise level, the playback volume of device 301 may decrease 320 from volume level 4 to analog increment 308 such that the playback volume may decrease to 60.4 dB without the user providing an input and independent of the digital gain. The playback volume of device 301 may continue to decrease 322 to analog increment 306 such that the playback volume may continue to decrease to 59.4 dB. While not shown, if the background noise continues to decrease or the device determines that further analog loss is required, the playback volume of device 301 may decrease up to analog increment 304 before reaching volume level 302. The progressive transition of the playback volume from volume level 4, to volume level 4 plus negative analog gain 306 may occur over a predetermined period of time.

FIGS. 4A-4D illustrate another example of the progressive transition of the playback volume in a location with an increased background noise level, such as the city.

FIG. 4A illustrates an example, much like in FIGS. 2A-2C and 3A-3C, where user 400 may be wearing a device 401, such as earbuds, with a current playback volume corresponding to volume level 4. Volume levels 402, 410, 418, 426 may correspond to volume levels 3, 4, 5, 6 of a volume table, respectively. Each analog increment 404, 406, 408, 412, 414, 416, 420, 422, 424 may correspond to an analog gain of 1 dB.

FIG. 4B illustrates an example where user 400 enters an atmosphere having an increased background noise level, such as user 400 walking past a busy intersection with cars honking their horn. In response to the increased background noise level, the playback volume of device 401 may increase 430 to analog gain 412.

FIG. 4C illustrates an example where user 400 provides an input to increase the playback volume. For example, user 401 may determine that the increase in playback volume to analog gain 412 was not enough and may provide an input to device 401. The input provided by user 401 may cause device apply a digital gain, or increase 432, to amplify the output signal to increase the playback volume. Accordingly, after user 400 provides an input, the playback volume of device 401 may be the applied digital gain from volume level 4 plus analog gain 412 to volume level 5.

FIG. 4D illustrates an example where user 400 remains in an atmosphere having an increased background noise level. For example, while the user may have passed the busy intersection, the user 400 may now be near an outdoor concert. The playback volume of device 401 was previously set to volume level 5. The playback volume increase 434 based on the determined background noise to analog increment 420. While not shown, if the background noise level increases or the device determines that further analog gain is required, the playback volume of device 401 may increase up to analog increment 424. Alternatively, if the background noise level decreases, the device may decrease the playback volume, such that the playback volume returns to volume level 5 or decreases by an analog loss. The analog gain may return to 0 dB gain when the background noise level decreases below a threshold background noise level. Alternatively, the analog gain may return to 0 dB gain when the user provides an input to change the playback volume level.

FIGS. 5A-5D illustrate an example of the progressive transition of the playback volume when going from a location with an increased background noise level to a location with a decreased background noise level.

FIG. 5A illustrates an example where user 500 may be walking through an atmosphere with increased background noise, such as the city, wearing device 501, such as earbuds, to reach an intended destination, such as the library. The playback volume may correspond to volume level 5. Volume levels 205, 210, 518, 528 may correspond to volume levels 3, 4, 5, 6 of a volume table, respectively. Each analog increment 504, 506, 508, 512, 514, 516, 520, 522, 524 may correspond to an analog gain.

FIG. 5B illustrates an example where user 500 may be walking through an atmosphere with decreased background noise, such as when user 500 is approaching the library. Near the entrance of the library, the background noise level may be less than when walking the city streets. Therefore, device 501 may determine that the background noise level has decreased. In determining the background noise level has decreased, the playback volume may progressively transition to a decreased playback volume. For example, the playback volume may experience a negative analog gain 530 to analog increment 516.

FIG. 5C illustrates an example where user 500 is within an atmosphere with decreased background noise, such as inside the library. Once user 500 is inside of the library, user 500 may provide an input to device 501 to decrease 532 the playback volume. For example, the input provided by the user may cause the device to apply a negative digital gain, or a digital loss, thereby changing the volume level from volume level 5 to volume level 4. Accordingly, after user 500 provides an input, the current playback volume of device 501 may be the applied digital loss 532 from volume level 5 and analog loss 516 to volume level 4.

FIG. 5D illustrates an example where user 500 remains in an atmosphere having decreased background noise level. Device 501 may determine that the background noise level may still require further fine adjustments of the playback volume. For example, the playback volume may decrease 534 to analog increment 508 in response to the determined decreased background noise level. The progressive transition of the playback volume from volume level 4 to analog increment 508 may occur over a predetermined period of time. While not shown, if the background noise level decreases or the device determines the further analog gain is required, the playback volume of device 501 may decrease up to analog increment 504. Thus, analog loss may occur up to volume level 3. Continuing with this example, the analog loss may cause the playback volume to be less than the playback volume of volume level 3. Alternatively, if the background noise increases, the device may increase the playback volume, such that the playback volume returns to volume level 4 or increases by an analog gain.

Figures 6, 7:
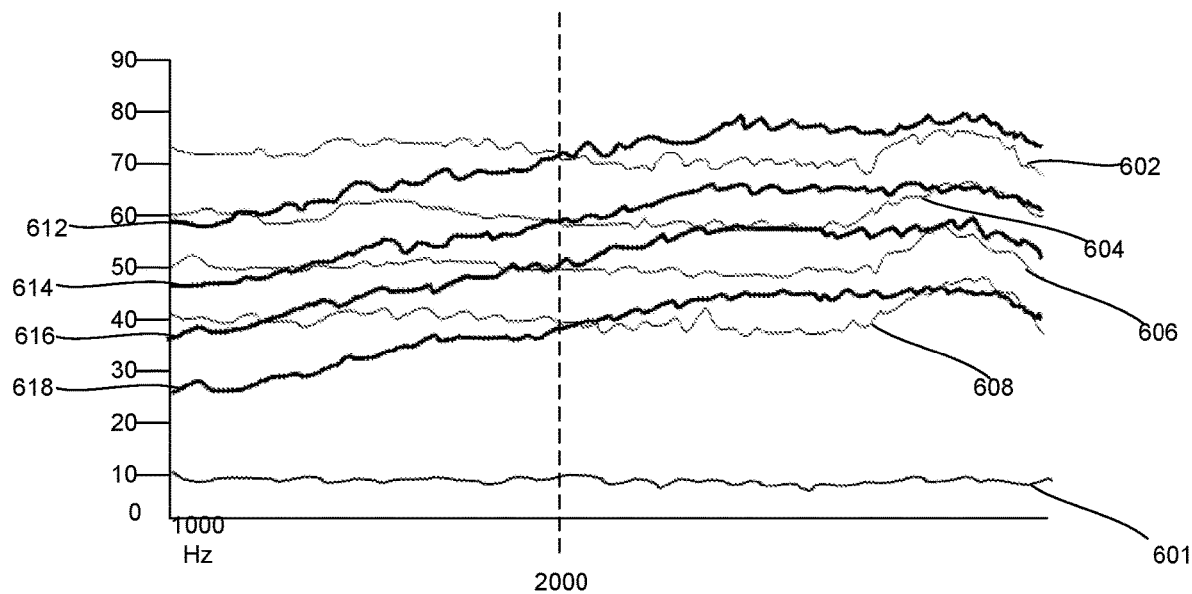
FIG. 6 is a graphical representation illustrating an example of weighted playback levels and background noise levels according to aspects of the disclosure.
FIG. 7 is a chart illustrating an example of weighted playback levels, background noise levels, and background noise estimations for each volume level according to aspects of the disclosure.

FIG. 6 illustrates a graphical comparison between the playback volume and background noise frequency. The background noise estimator may measure the power sum of the Fast Fourier Transformation ("FFT") noise from a frequency of 1000 Hz (1 kHz) to 5000 Hz (5 kz) over a predetermined period of time. The predetermined period of time may be 16 ms. A certain time period of the collected data, for example 2.976 s, may be averaged and used to determine the background noise level. As shown in FIG. 6, the playback volume and the background noise may cross over at a frequency of 2000 Hz (2 kHz).

FIG. 7 is a chart containing the information graphed in FIG. 6, including the volume levels, A-weighted playback level measured in dBA for each volume level, the background noise crossing at 2000 Hz measure in dB, and the background noise estimator measured in dB. The volume levels, or steps, may have an A-weighted decibel level, or playback level, measured in dBA. A-weighted decibel level may provide a relative loudness of sound as perceived by the user. Using an A-weighted decibel level may reduce the relative loudness as heard by the user by reducing lower frequencies. A-weighting may also be used in the measurement of background noise. Line 601 represents the noise floor with the device in the ear of the user. The noise floor may measure the lowest reference noise at that point. The measurements of background noise may be referenced from this noise floor.

Volume level 15 may, for example, have an A-weighted playback level of 97.3 dBA. The loudest background noise level 602, as shown in FIG. 6, may be 105 dB. Thus, volume level 15, shown as line 612 on FIG. 6, may cross over with background noise level 602 at 2000 Hz. The background noise may be calculated by averaging the power sum of the FFT noise collected over a certain period of time. The background noise when crossing the 2000 Hz threshold may be 94 dB. Therefore, the background noise estimator may be 90 dB. The background noise estimator value may be used to calculate the increase or decrease in playback volume for the progressive transition. The increase or decrease in playback volume may be the analog gain or loss. Volume level 12 may have an A-weighted playback level of 88.5 dBA. Volume level 12, shown as line 614 on FIG. 6, may cross over with background noise 604 at 2000 Hz. The background noise when crossing the 2000 Hz threshold may be 85 dB. Therefore, the background noise estimator may be 80 dB. Volume level 9 may have an A-weighted playback level of 75 dBA. Volume level 9, shown as line 616 on FIG. 6, may cross over with background noise 606 at 2000 Hz. The background noise when crossing the 2000 Hz threshold may be 75 dB. Therefore, the background noise estimator may be 70 dB. Volume level 5 may, for example, have an A-weighted playback level 64.3 dBA. Volume level 5, shown as line 618 on FIG. 6, may cross over with background noise 608. The background noise when crossing the 2000 Hz threshold may be 65 dB. Therefore, the background noise estimator may be 60 dB. The numbers provided herein for the A-weighted playback level, the background noise level, and the background noise estimator are merely examples according to one embodiment and are not meant to be limiting. Depending on the device, the user, and the location, the values may be different than those shown in FIGS. 6 and 7. Thus, the A-weighted playback level, background noise crossing at 2000 Hz, and background noise estimator may be any values that correlate to the default volume levels of the device.

Figure 8:
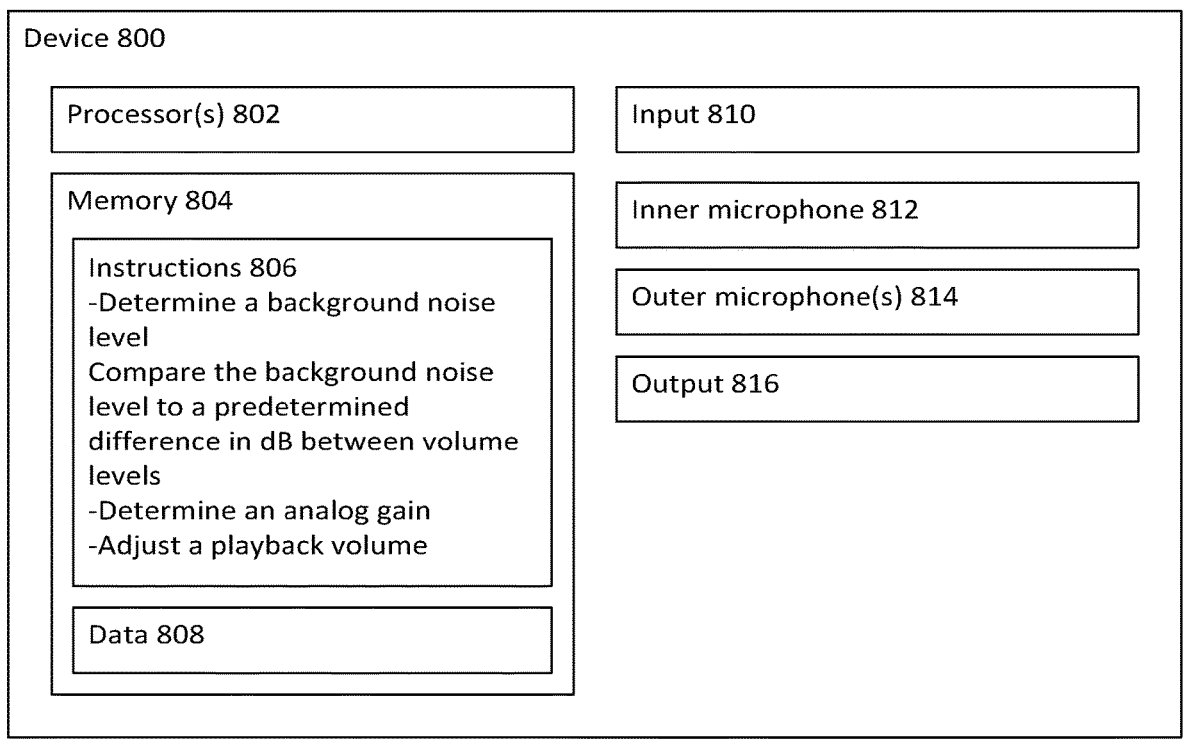
FIG. 8 is a block diagram illustrating an example device according to aspects of the disclosure.

FIG. 8 provides an example block diagram illustrating components of the device 800. As shown, the device 800 includes various components, such as one or more processors 802, memory 804, and other components typically present in microprocessors, general purpose computers, or the like. Device 800 also includes input 810, an inner microphone 812, one or more outer microphones 814, an output 816, and amplifiers 820.

The one or more processors 802 may be any conventional processors, such as commercially available microprocessors. Alternatively, the one or more processors may be a dedicated device such as an application specific integrated circuit (ASIC) or other hardware-based processor. Although FIG. 8 functionally illustrates the processor, memory, and other elements of device 800 as being within the same block, it will be understood by those of ordinary skill in the art that the processor, computing device, or memory may actually include multiple processors, computing devices, or memories that may or may not be stored within the same physical housing. Similarly, the memory may be a hard drive or other storage media located in a housing different from that of device 800. Accordingly, references to a processor or computing device will be understood to include references to a collection of processors or computing devices or memories that may or may not operate in parallel.

Memory 804 may store information that is accessible by the processors 802, including instructions 806 that may be executed by the processors 802, and data 808. The memory 804 may be of a type of memory operative to store information accessible by the processors 802, including a non-transitory computer-readable medium, or other medium that stores data that may be read with the aid of an electronic device, such as a hard-drive, memory card, read-only memory ("ROM"), random access memory ("RAM"), optical disks, as well as other write-capable and read-only memories. The subject matter disclosed herein may include different combinations of the foregoing, whereby different portions of the instructions 506 and data 808 are stored on different types of media.

Data 808 may be retrieved, stored or modified by processors 802 in accordance with the instructions 806. For instance, although the present disclosure is not limited by a particular data structure, the data 808 may be stored in computer registers, in a relational database as a table having a plurality of different fields and records, XML documents, or flat files. The data 808 may also be formatted in a computer-readable format such as, but not limited to, binary values, ASCII or Unicode. By further way of example only, the data 508 may be stored as bitmaps comprised of pixels that are stored in compressed or uncompressed, or various image formats (e.g., JPEG), vector-based formats (e.g., SVG) or computer instructions for drawing graphics. Moreover, the data 808 may comprise information sufficient to identify the relevant information, such as numbers, descriptive text, proprietary codes, pointers, references to data stored in other memories (including other network locations) or information that is used by a function to calculate the relevant data.

The instructions 806 can be any set of instructions to be executed directly, such as machine code, or indirectly, such as scripts, by the processor 802. In that regard, the terms "instructions," "application," "steps," and "programs" can be used interchangeably herein. The instructions can be stored in object code format for direct processing by the processor, or in any other computing device language including scripts or collections of independent source code modules that are interpreted on demand or compiled in advance. Functions, methods and routines of the instructions are explained in more detail below.

The device 800 may further include an input 810 for receiving volume adjustment commands. The input 810 may be, for example, a touch sensor, dial, button, or other control for receiving a manual command. The device 800 may also include an output 816. The output 816 may be, for example, a speaker.

Device 800 may have one or more microphones in a variety of locations. For example, inner microphone 812 may be located such that it can determine a playback volume. According to some embodiments, there may be one or more outer microphones 814 located on the exterior of device 800. Outer microphones 814 may be able to detect background noise. The outer microphones 814 may also be able to detect sound to be processed by the one or more processors within device 800 and transmit the sound to another device.

Device 800 may include at least two amplifiers. A first amplifier 820 may be a digital amplifier. The digital amplifier may apply a digital gain to the signal, as described in more detail herein. A second amplifier 820 may be an analog amplifier. The analog amplifier may adjust the analog gain, as described in more detail herein.

It should be understood that the device 800 may include other components which are not shown, such as a battery, charging input for the battery, signals processing components, etc. Such components may also be utilized in execution of the instructions 806.

Figure 9:
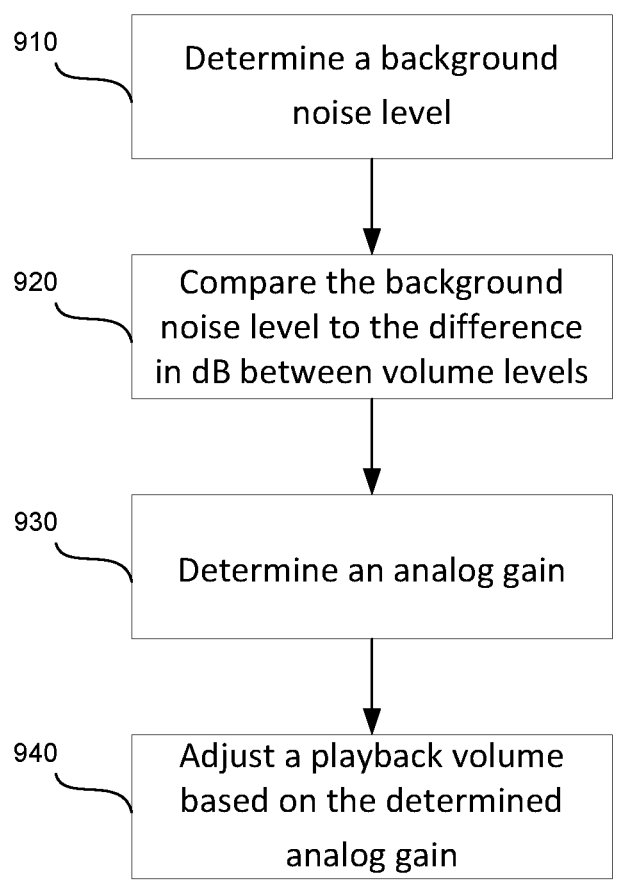
FIG. 9 is a flow diagram illustrating an example method in accordance with aspects of the disclosure.

FIG. 9 illustrates a sequence of steps that may occur when progressively transitioning the playback volume of a device based on a background noise level. For example, in block 910, the device may determine the background noise level. According to some examples, the outer microphone(s) may be listening to the background noise. In other examples, the inner microphone may be listening to the background noise. The background noise picked up by the one or more microphones may then be processed to determine the background noise level. For example, the background noise level in a quiet place, such as a library, may be 30 dB. Alternatively, the background noise level in a busy place, such as on a city street, may be between 80-90 dB. Further, the background noise level may be 90 dB and above when the user is performing a noisy activity, such as mowing the lawn using a gas powered lawnmower or attending a concert.

In block 920, the difference between the determined background noise level in dB and the A-weighted playback level in dBA may be compared to the loudness delta. Further, in block 930, the device may determine an analog gain based on the difference between the background noise level and the A-weighted playback level. For example, the difference between background noise level and A-weighted playback level may be compared to the loudness delta between volume steps in the volume table. When the loudness delta is greater than or equal to the difference between the background noise level and the A-weighted playback level, the analog gain may be applied. This may be shown as:

$$\text{loudness delta} \geq (\text{background noise level} - \text{A-weighted playback level})$$

For example, the analog gain may increase the playback volume up to a value corresponding to the comparison, such as 6 dB. When loudness delta is less than the difference between background noise level and the A-weighted playback level, the analog gain may be, for example, up to 3 dB. According to some examples, the analog gain may be equal to the default loudness delta of the device. Additionally or alternatively, the analog gain may be a multiple of the loudness delta for the device. However, the analog gain may increase or decrease the playback up to a value based on the device, the loudness delta, the background noise level, and the current playback level. Thus, an analog gain of 3 dB and 6 dB are merely examples, and other values are possible.

In block 940, the device may adjust the playback volume by increasing or decreasing the playback volume based on the determined analog gain. The playback volume may progressively transition based on the determined analog gain. The transition may occur over a predefined period of time.

The progressive transition of the playback volume provides the user with a greater listening experience. As a user enters an atmosphere with an increased background noise level, a progressive transition to increase the playback volume may prevent the user from losing any content. The progressive transition of playback volume may reduce the need for user input as the user enters an atmosphere with increased or decreased background noise. Further, the progressive transition of playback volume does not require a manual input for the adjustment of the playback volume, thereby improving the user's experience.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An audio playback device, comprising:
   a first amplifier configured to adjust a playback volume of the device among first increments in a volume table, the volume table including a plurality of the first increments between a minimum volume and a maximum volume, wherein:
      each of the plurality of first increments is spaced by a predetermined difference; and
      the first amplifier is a digital amplifier;
   one or more processors configured to determine a background noise level; and
   a second amplifier in communication with the one or more processors, the second amplifier configured to adjust the playback volume, in response to the determined background noise level, by one or more second increments, wherein:
      the second increments are smaller than the first increments;
      the second amplifier is an analog amplifier; and
      the second increments are calculated as a function of the determined background noise level.

2. The audio playback device of claim 1, further comprising:
   one or more microphones configured to receive audio input, wherein the determined background noise level is based on the received audio input; and
   one or more speakers for playback of audio output.

3. The audio playback device of claim 1, wherein each of the first increments encompasses a plurality of the second increments.

4. The audio playback device of claim 1, wherein adjusting the playback volume using the second amplifier does not adjust the playback volume using the first amplifier.

5. The device of claim 1, wherein when the difference between the determined background noise level and the playback volume is less than the predetermined difference, adjusting the playback volume further comprises adjusting the playback volume by up to an amount equivalent to one of the first increments.

6. The device of claim 1, wherein when the difference between the determined background noise level and the playback volume is greater than or equal to the predetermined difference, adjusting the playback volume further comprises adjusting the volume by up to an amount equivalent to two of the first increments.

7. The audio playback device of claim 1, wherein the second increments are further calculated as a function of one or more of the first increments.

8. A method, comprising:
   adjusting, by a first amplifier comprising a digital amplifier, a playback volume of a device among first increments in a volume table, the volume table including a plurality of the first increments between a minimum volume and a maximum volume, wherein each of the plurality of first increments is spaced by a predetermined difference;
   determining, by one or more processors, a background noise level;
   calculating, by the one or more processors and as a function of the determined background noise level, one or more second increments smaller than the first increments; and
   adjusting, by a second amplifier comprising an analog amplifier, the playback volume in response to the determined background noise level, wherein the adjusting by the second amplifier is among the one or more second increments.

9. The method of claim 8, wherein adjusting the playback volume does not adjust a digital gain.

10. The method of claim 9, wherein the digital gain corresponds to the volume table, such that adjusting the digital gain adjusts the playback volume to one of the total number of first increments.

11. The method of claim 8, wherein adjusting the playback volume comprises adjusting an analog gain resulting in a playback volume between increments in the volume table.

12. The method of claim 8, wherein determining the background noise level is based on a noise level detected by one or more microphones, the one or more microphones including an inner microphone that detects a volume heard by a user and an outer microphone that detects the background noise level.

13. An audio playback device, comprising:
   one or more microphones;
   one or more speakers for playback of audio output;
   a memory for storing a volume table, the volume table including a total number of increments between a minimum volume and a maximum volume, wherein each increment is spaced by a predetermined difference; and
   one or more processors in communication with the one or more microphones and the memory, the one or more processors being configured to:
      receive input from the one or more microphones;
      determine a background noise level based on the received input; and
      adjust a playback volume based on the determined background noise level, wherein adjusting the playback volume comprises adjusting an analog gain, which raises or lowers the playback volume an amount less than the predetermined difference, the amount calculated as a function of the determined background noise level.

14. The device of claim 13, wherein adjusting the playback volume does not adjust a digital gain.

15. The device of claim 14, wherein the digital gain corresponds to the volume table, such that adjusting the digital gain adjusts the playback volume to one of the total number of increments.

16. The device of claim 13, wherein adjusting the playback volume comprises adjusting an analog gain resulting in a playback volume between increments in the volume table.

17. The device of claim 13, wherein when the difference between the determined background noise level and the playback volume is less than the predetermined difference, adjusting the playback volume further comprises adjusting the playback volume by an amount equivalent to one of the total number of increments.

18. The device of claim 13, wherein when the difference between the determined background noise level and the playback volume is greater than or equal to the predetermined difference, adjusting the playback volume further comprises adjusting the volume by an amount equivalent to two of the total number of increments.

19. The device of claim 13, wherein the amount is further calculated as a function of one or more of the increments.

* * * * *